(12) United States Patent
Rasras

(10) Patent No.: US 8,532,441 B2
(45) Date of Patent: Sep. 10, 2013

(54) OPTICAL DEVICE FOR WAVELENGTH LOCKING

(75) Inventor: Mahmoud Rasras, Berkeley Heights, NJ (US)

(73) Assignee: Alcatel Lucent, Paris (FR)

( * ) Notice: Subject to any disclaimer, the term of this patent is extended or adjusted under 35 U.S.C. 154(b) by 175 days.

(21) Appl. No.: 12/611,187

(22) Filed: Nov. 3, 2009

(65) Prior Publication Data

US 2011/0103415 A1 May 5, 2011

(51) Int. Cl.
| | | |
|---|---|---|
| *G02F 1/295* | (2006.01) | |
| *G02B 6/26* | (2006.01) | |
| *G02B 6/42* | (2006.01) | |
| *H01S 3/10* | (2006.01) | |
| *H01S 3/13* | (2006.01) | |

(52) U.S. Cl.
USPC ............... 385/5; 385/31; 372/20; 372/29.011

(58) Field of Classification Search
USPC .............................. 385/31, 5; 372/20, 29.011
See application file for complete search history.

(56) References Cited

U.S. PATENT DOCUMENTS

| | | | |
|---|---|---|---|
| 5,212,745 A | 5/1993 | Miller | |
| 6,315,462 B1 | 11/2001 | Anthamatten et al. | |
| 6,700,910 B1 | 3/2004 | Aoki et al. | |
| 6,909,536 B1 | 6/2005 | Walker et al. | |
| 7,021,840 B2 | 4/2006 | Kuhara et al. | |
| 7,035,505 B2 | 4/2006 | Shen et al. | |
| 7,158,699 B2 | 1/2007 | Welch et al. | |
| 7,338,637 B2 | 3/2008 | Pease et al. | |
| 7,565,038 B2 | 7/2009 | Earnshaw | |
| 7,586,084 B2 * | 9/2009 | Itoh et al. | 250/227.28 |
| 2002/0076149 A1 * | 6/2002 | Deacon | 385/27 |
| 2002/0150323 A1 | 10/2002 | Nishida et al. | |
| 2002/0197010 A1 | 12/2002 | Kato et al. | |
| 2003/0081878 A1 | 5/2003 | Joyner et al. | |
| 2004/0033004 A1 | 2/2004 | Welch et al. | |
| 2004/0141691 A1 | 7/2004 | Wiesmann et al. | |
| 2005/0074209 A1 * | 4/2005 | Baumann et al. | 385/50 |
| 2005/0213883 A1 | 9/2005 | Welch et al. | |
| 2006/0050355 A1 | 3/2006 | Godfreid et al. | |
| 2009/0214160 A1 | 8/2009 | Arol et al. | |
| 2010/0247021 A1 | 9/2010 | Cunningham et al. | |
| 2010/0247022 A1 | 9/2010 | Li et al. | |
| 2010/0247029 A1 | 9/2010 | Li et al. | |
| 2011/0103415 A1 | 5/2011 | Rasras | |
| 2011/0250725 A1 | 10/2011 | Yeh et al. | |

OTHER PUBLICATIONS

Teng, Jie, et al., "Athermal Silicon-on-insulator ring resonators by overlaying a polymer cladding on narrowed waveguides", Optics Express, vol. 17, No. 17, Aug. 17, 2009, 7 pages.
D. T. Neilson et al, "Direct Laser Modulation", Filed on Jan. 31, 2011, U.S. Appl. No. 13/018,109.

(Continued)

*Primary Examiner* — Ryan Lepisto
*Assistant Examiner* — Jerry Blevins
(74) *Attorney, Agent, or Firm* — Hitt Gaines, P.C.

(57) ABSTRACT

An optical device comprising a 1×2 optical coupler on a planar substrate and a waveguide on the planar substrate, the waveguide having a first arm and a second arm coupled to the 1×2 optical coupler. The device also comprises an optical resonator on the planar substrate, wherein the optical resonator is optically coupled to the first arm and the optical resonator is substantially athermalized.

19 Claims, 8 Drawing Sheets

(56) References Cited

OTHER PUBLICATIONS

Flavio Pardo, "Optical Transmitter With Flip-Chip Mounted Laser or Integrated Arrayed Waveguide Grating Wavelength Division Multiplexer", Filed on Nov. 12, 2010, U.S. Appl. No. 12/944,917.

Mark P. Earnshaw, "Opto-Electronic Assembly for a Line Card", Filed on Nov. 12, 2010, U.S. Appl. No. 12/944,875.

D. T. Neilson et al, "Optical Assembly for a WDM Receiver or Transmitter", Filed on Nov. 12, 2010, U.S. Appl. No. 12/944,939.

D. Gill, "Wavelength Aligning Multi-Channel Optical Transmitters", Filed on Nov. 12, 2010, U.S. Appl. No. 12/945,550.

M. Rasras, "Thermally Controlled Semiconductor Optical Waveguide", Filed on Nov. 12, 2010, U.S. Appl. No. 12/944,946.

Doerr, et al.; "Tunable dispersion compensator with integrated wavelength locking"; 3 Pages, Published 2005.

Shakouri, Hooman, "Wavelength lockers make fixed and tunable lasers precise"; http://w.pennet.com/display_article/132468/ARTCL/none/none/1/Wavenlength-lockers-makefix . . . ; WDM Solutions—Wavelength lockers make fixed and tunable lasers precise; 6 pages, Published 2009.

Doerr, C.R. et al., "Monolithic silicon coherent receiver," Optical Fiber Communication—incudes post deadline papers, 2009. OFC 2009. Conference on , vol., No., pp. 1-3, Mar. 22-26, 2009.

Yiu-Man Wong, et al., "Technology development of a high-density 32-channel 16-Gb/s optical data link for optical interconnection applications for the optoelectronic technology consortium (OETC)," Lightwave Technology, Journal of, vol. 13, No. 6, pp. 995-1016, Jun. 1995.

Young, M.G., et al., "A 16*1 Wavelength Division Multiplexer with Integrated Distributed Bragg Reflector Lasers and Electroabsorption Modulators," Photonics Technology Letters, IEEE , vol. 5, No. 8, pp. 908-910, Aug. 1993.

International Search Report and Written Opinion; Mailed Jun. 28, 2012 for corresponding PCT Application No. PCT/US2011/053812.

* cited by examiner

OPTICAL DEVICE FOR WAVELENGTH LOCKING

TECHNICAL FIELD

The present disclosure is directed, in general, to optical devices and more specifically, optical wavelength lockers, and, methods of using and manufacturing the same.

BACKGROUND

This section introduces aspects that may be helpful to facilitating a better understanding of the inventions. Accordingly, the statements of this section are to be read in this light. The statements of this section are not to be understood as admissions about what is in the prior art or what is not in the prior art.

The efficiency of optical telecommunication systems are enhanced by using an optical device to monitor and stabilize a wavelength of light passing through the system.

SUMMARY OF THE INVENTION

To address some of the above-discussed limitations, one embodiment is an optical device. The device comprises a 1×2 optical coupler on a planar substrate and a waveguide on the planar substrate, the waveguide having a first arm and a second arm coupled to the 1×2 optical coupler. The device also comprises an optical resonator on the planar substrate, wherein the optical resonator is optically coupled to the first arm and the optical resonator is substantially athermalized Another embodiment is an optical device that also comprises a 1×2 optical coupler on a planar substrate, a waveguide on the planar substrate, the waveguide having a first arm and a second arm coupled to the 1×2 optical coupler. The device further comprises first and second optical resonators on the planar substrate. The first optical resonator is optically coupled to the first arm and the second optical resonator is optically coupled to the second arm. First and second photo-detectors of the device are located on the planar substrate and optically coupled to output ends of the first arm and the second arm, respectively. A control module of the device is located on the planar substrate, the control module being electrically coupled to the first and second photo-detectors and also configured to control an output wavelength of a light-source optically coupled to the 1×2 optical coupler.

Another embodiment is a method of using an optical device. The method comprises splitting a light beam into a first beam that passes through a first arm of a waveguide, and, into a second beam that passes through a second arm of the waveguide. The method also comprises passing at least one of the first beam or second beam through one or more optical resonators that are optically coupled to at least one of the first or second arms. The method further comprises adjusting a resonance frequency of the one or more optical resonators so that an operating wavelength of the light beam is positioned over a sloped portion of a transmittance curve of the at least one first arm or second arm optically coupled to the one or more optical resonators. The method also comprises determining a difference in the light-transmittance of the first beam exiting the first arm and the light-transmittance of the second beam exiting the second arm, and, adjusting the operating wavelength if the difference in transmittance exceeds a predefined value.

Another embodiment is a method of manufacturing an optical device. The method comprises providing a planar substrate, wherein the planar substrate includes a light-guiding layer located on a light-cladding layer. The method also comprises patterning the light-guiding layer to form lightguiding cores of one or more optical resonators. The method further comprises substantially athermalizing at least one of the optical resonator cores.

BRIEF DESCRIPTION OF THE DRAWINGS

The embodiments of the disclosure are best understood from the following detailed description, when read with the accompanying FIGUREs. Corresponding or like numbers or characters indicate corresponding or like structures. Various features may not be drawn to scale and may be arbitrarily increased or reduced in size for clarity of discussion. Reference is now made to the following descriptions taken in conjunction with the accompanying drawings, in which.

DETAILED DESCRIPTION

One embodiment of the present disclosure is an optical device. Some embodiments of the optical device can be configured as, or, to include, a wavelength locker (WL). In some cases, the WL can be used to stabilize and monitor laser wavelength in telecommunication systems that use wavelength-division multiplexing (WDM). For instance, some embodiments of the optical device configured as (or to include) a WL, can be used to align the carrier frequency of the laser to be within about percent of the channel spacing of a wavelength-division multiplexed system, such as specified by the International Telecommunication Union (e.g., the so-called "ITU-Grid").

Embodiments of the disclosed optical device can be integrated using a planer lightwave circuit (PLC) platform. This can provide advantages of easier mass production and assembly as compared to, e.g., a WL that includes etalon-based Fabry-Perot filters or Fiber Bragg Gratings. Integrating the device in a PLC platform also facilitates combination with other optical components, such as multiplexers and demultiplexers, photodetectors, and controlling integrated circuits (IC) all on the same substrate platform (e.g., an IC chip).

Figure 1A:
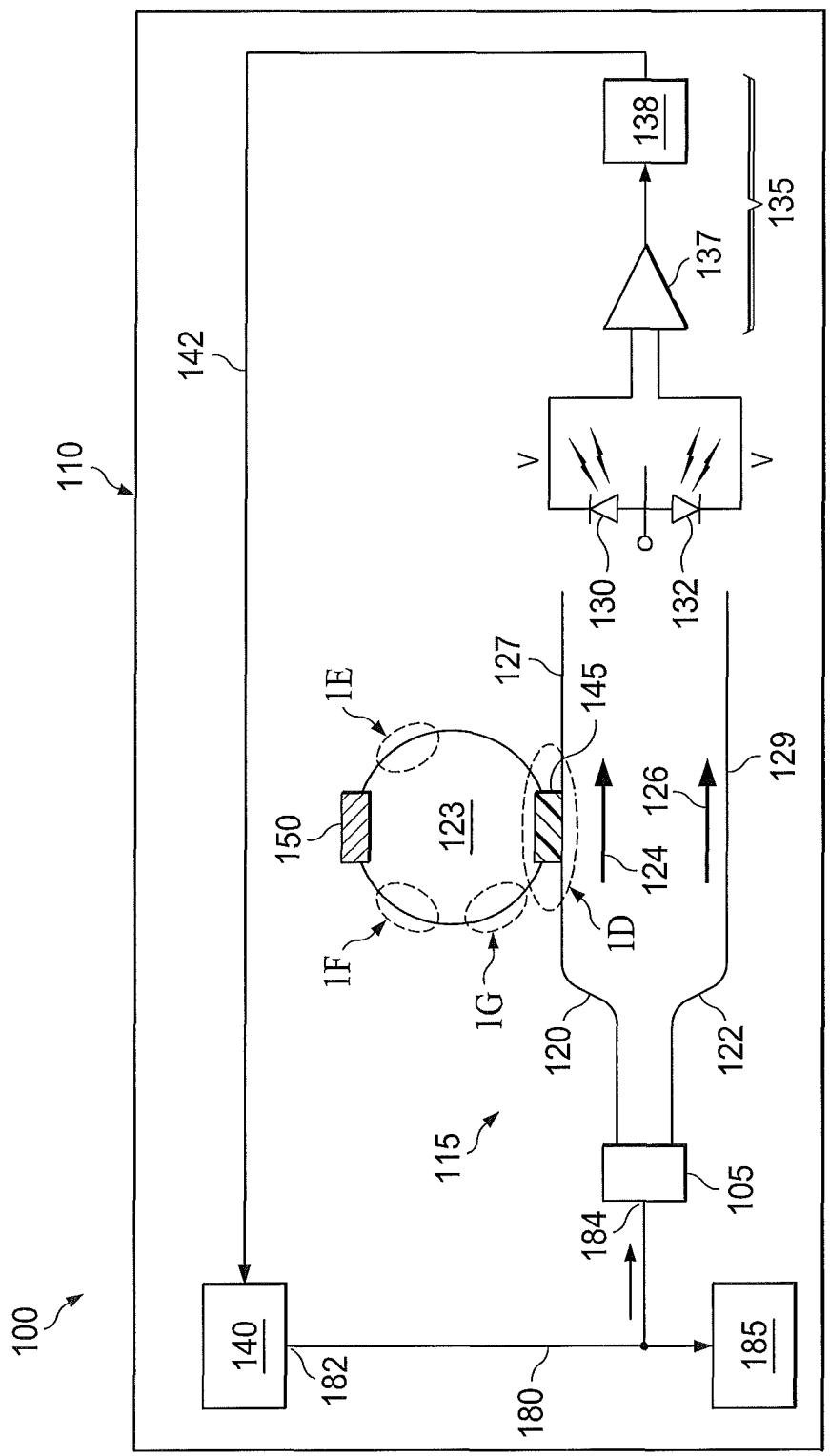
FIG. 1A presents an example optical device of the disclosure having a single optical resonator.

FIG. 1A presents a layout diagram of an example optical device 100 of the disclosure. The optical device 100 comprises a 1×2 optical coupler 105 on a planar substrate 110, and a waveguide 115 also on the planar substrate 110. The waveguide 115 has a first arm 120 and a second arm 122 coupled to the 1×2 optical coupler 105. The device 100 also includes an optical resonator 123 also on the planar substrate 110. The optical resonator 123 is optically coupled to the first arm 120, and, the optical resonator 123 is substantially athermalized.

The term substantially athermalized as used herein is defined as the resonance frequency of the optical resonator 123 changing by less than about 1E-4 nanometers/° C. in the operating wavelength range of the device 100 near room temperature (e.g., about 20° C.). For example some embodiments of the device 100 configured as a WL are configured to operate in one or both the C or L optical communication bands. For the purposes of the present disclosure, C and L optical communication bands refer to a wavelength range of about 1530 nm to 1565 nm, and, about 1565 nm to 1625 nm, respectively.

Some embodiments of the 1×2 optical coupler are directional couplers, such as 3 DB directional couplers. Embodiments of the 1×2 optical coupler include 50/50 Y-splitters (e.g., coupling coefficient, K=0.5), or couplers such as Mach Zehnder interferometers (MZI). The waveguide 115 can be composed of any material used in guiding optical wavelengths of light, such as semiconductor materials like silicon, dielectric materials such as silicates and silica glass used in PLCs, or organic polymers such as poly(methyl methacrylate (PMMA), fluoropolymers or silicone polymers.

Some embodiments of the optical resonator 123 include ring resonators, such as all-pass ring resonator filters. The optical resonator 123 can facilitate monitoring shifts in the wavelength of a light passing through the 1×2 coupler 105 to the waveguide 115. Shifts in the wavelength of the light can be detected by comparing the intensity of light 124 at an output end 127 of the first arm 120 to the intensity of light 126 at the output end 129 of the second arm 122. E.g., an incoming light can be split equally into the two arms 120, 122 and at least one of the arms (e.g., first arm 120 in FIG. 1) is optically coupled to the optical resonator 123.

Figure 1B:
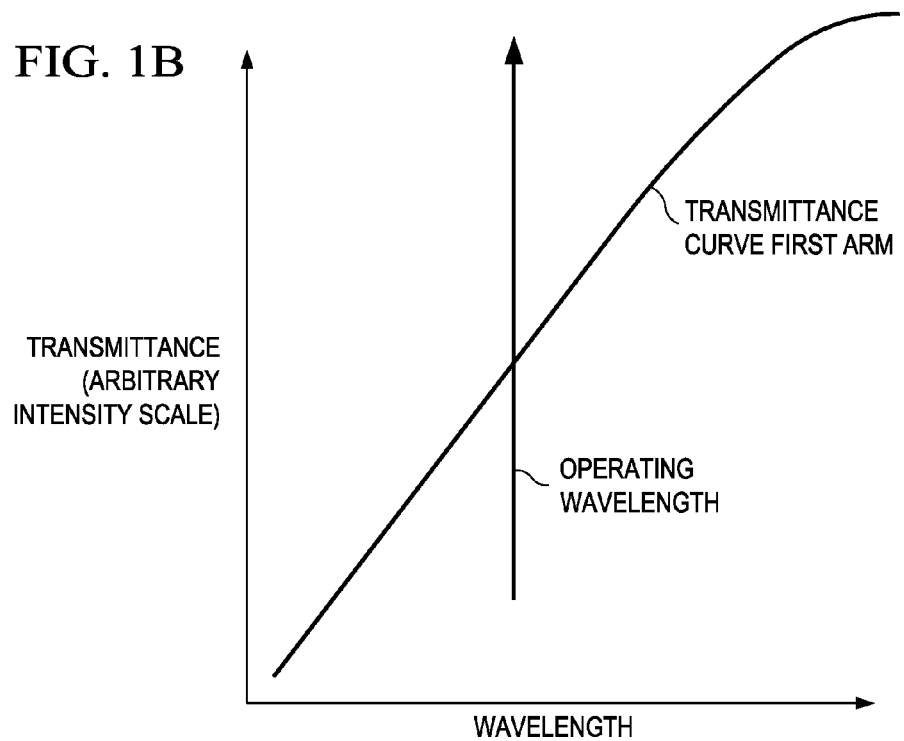
FIGS. 1B and 1C presents example transmittance curves for waveguide arms of an optical device of the disclosure, such as the device depicted in FIG. 1A.

FIG. 1B shows a portion of an example transmittance curve, as a function of wavelength, for the arm 120 coupled to the optical resonator 123 (FIG. 1A). The operating wavelength can be located on a positively sloping part of the curve, although in other example embodiment the operating wavelength of the light-source can be located on a negatively sloping part.

Figure 1C:
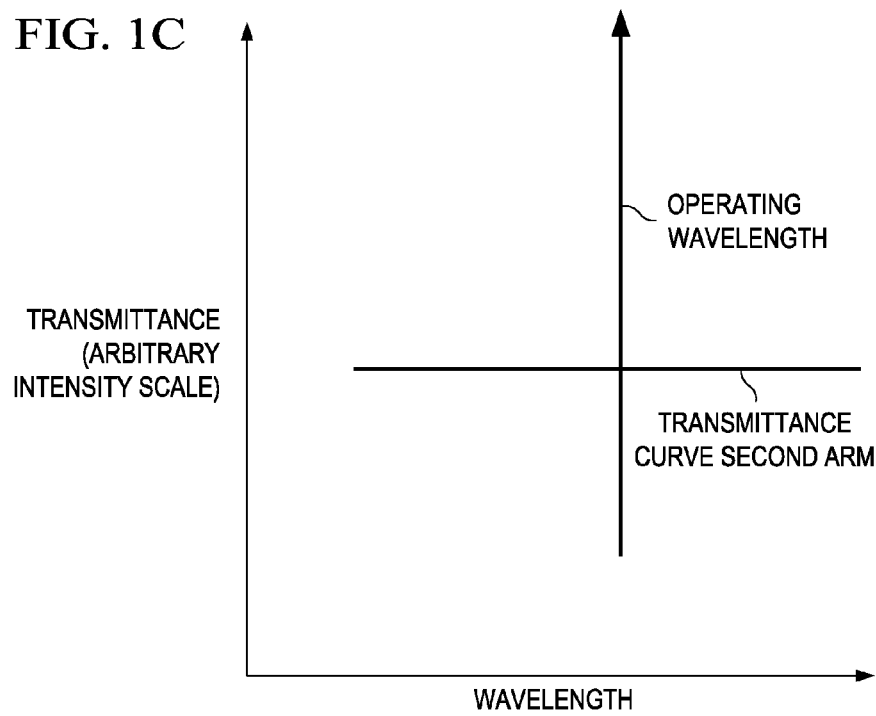
Figure 1D:
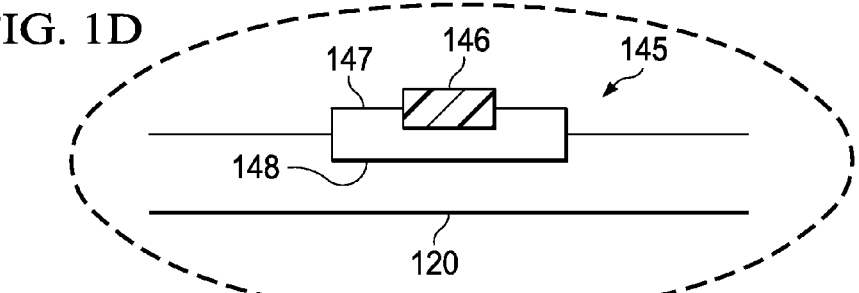
FIG. 1D presents a detailed view of an example adjustable optical coupler of an optical device of the disclosure, such as the device depicted in FIG. 1A.

For the embodiment shown in FIG. 1A, the light passing through the other arm is not filtered, e.g., the second arm 122 is not coupled to an optical resonator. FIG. 1C shows a portion of an example transmittance curve for the arm 122 not coupled to the optical resonator 123. As shown in FIG. 1C, the transmittance curve is substantially constant as a function of wavelength.

As further illustrated in FIG. 1A, some embodiments of the device 100 can further include first and second photo-detectors 130, 132 located on the planar substrate 110. The first and second photo-detectors 130, 132 are optically coupled to output ends 127, 129 of the first and second arm 120, 122 of the waveguide 115, respectively. In some embodiments, the first and second photo-detectors 130, 132 are germanium-containing photodiode detectors, but other detector type, familiar to those skilled in the art could be used. The photo-detectors 130, 132 also can facilitate monitoring shifts in the wavelength of a light. For instance, the light intensity at the ends 127, 129 of each of the arms 120, 122 monitored by one of the photo-detectors 130, 132. For the example embodiment depicted in FIGS. 1A-1C, if the light's wavelength is shifted to a longer wavelength, the voltage (V) generated at the first photo-detector 130 will increase, while the voltage (V) at the second photo-detector 132 will remain constant.

As further illustrated in FIG. 1, some embodiments of the device 100 can further include a control module 135 located on the planar substrate 110. The control module 135 can be electrically coupled to the first and second photo-detectors 130, 132. The control module 135 can be or include electronic circuitry located on the planar substrate 110 (e.g., an integrated circuit comprising an amplifier component 137 (e.g., a differential amplifier) and a control component 138) configured to detect the difference in currents from the photo-detectors 130, 132. The control module 135 can be configured to control an output wavelength of a light-source 140, e.g., optically coupled to the 1×2 optical coupler 105. Continuing with the example embodiment depicted in FIGS. 1A-1C, if the light shifts to a longer wavelength then the increased voltage, or other electrical signal, from the first photo-detector 130 to the control module 135 can increase compared to the voltage from the second photo-detector 132. If the different exceeds a defined threshold, the control module 135 can be configured to send a control signal 142 to the light-source 140 thereby causing a decrease the wavelength of light emitted by the light-source 140.

As further illustrated in FIG. 1A, in some embodiments of the device 100, the optical resonator 123 further includes an adjustable optical coupler 145 optically coupled to the first arm 120 and to a light-guiding core of the resonator 123 (e.g., the light-guiding core of a ring resonator). For instance as shown in the inset drawing FIG. 1D, in some embodiments, the adjustable optical coupler 145 can be configured as a MZI, such as a balanced MZI having a thermo-optic phase shifter 146 coupled to one of the two arms 147, 148 of the MZI. The adjustable optical coupler 145 can be used to adjust the optical coupling strength of the resonator 123 to the arm 120 and thereby facilitate adjusting the device's 100 sensitivity towards detecting a change in the wavelength of the light. For instance, a decrease in optical coupling can increase the slope of the transmittance curve (FIG. 1B), while an increase in optical coupling can decrease the slope.

As also show FIG. 1A, some embodiments of the optical resonator 123 further includes a phase shifter 150. In some embodiments the phase shifter 150 is configured as a thermo-optic phase shifter, e.g., as a metal contact coupled to the light-guide core of a ring resonator 123. The phase shifter facilitates tuning of the optical resonator 123 and thereby facilitates adjusting the device's 100 sensitivity towards detecting a change in the wavelength of the light. For instance, the optical resonator's 123 resonance frequency can be adjusted such that the wavelength of the light is located on a positively or negatively sloped portion of the transmittance curve such as depicted in FIG. 1B.

Figure 1E:
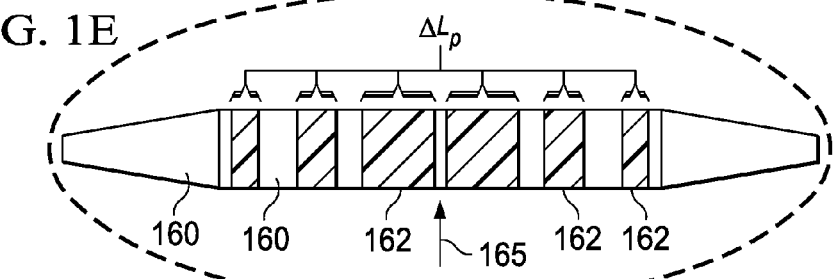
FIGS. 1E-1G present a detailed views of example portion of optical resonators of an optical device of the disclosure, such as the device depicted in FIG. 1A.
Figure 1F:
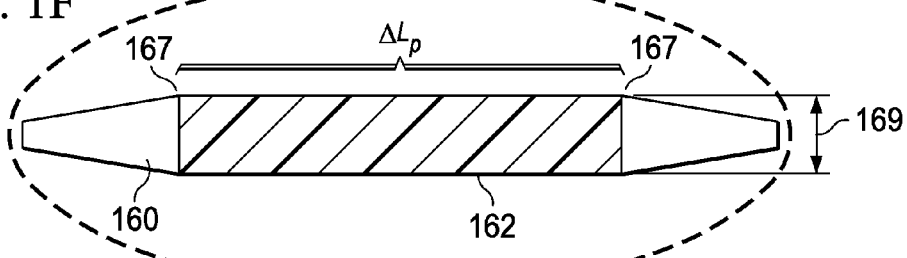

As illustrated in the inset diagrams shown in FIGS. 1E and 1F, in some embodiments the substantially athermalized optical resonator 123 includes a light-guiding core which includes a first core portion 160 with a positive thermo-optic coefficient, and, a different portion which includes a second core 162 with a negative thermo-optic coefficient. For instance, in some embodiments the first core portion 160 material includes silicon and the second core portion 162 material includes a polymer. Examples of suitable materials that can have negative thermo-optic coefficient include fluoroacrylate polymers or silicone polymers. The first and second core portions 160, 162 can be compositions of different materials (e.g., different types of fluoroacrylate or silicone polymers) to adjust the refractive index and thermo-optic coefficient to the appropriate value, e.g., to match the indexes of the first and second cores 160, 162.

An athermalized optical resonator 123 configured to have a light-guiding core with one or more of the first and second core portions 160, 162 with positive and negative thermo-optic coefficients, respectively, helps avoid the need to used thermo-electric temperature controllers to provide a thermally stable device 100. For instance, to minimize the effects of surrounding temperature variations on the device 100, the second core portion 162 of polymer material can be used to replace sections of a first portion core material 160 made of silica in a ring resonator 123. An appropriate length of polymer core second portions 162 of negative thermo-optic index coefficient can compensate for the silica waveguide portions 160 of positive thermo-optic index coefficient. In some embodiments where the device 100 further includes a phase shifter 150 optically coupled to the resonator 123, it can be advantageous for the phase shifter 150 to be optically coupled to a portion of the light-guiding core 160 of the resonator 123 that does not include the second core 162. For instance when the phase shifter 150 is configured as a thermo-optic phase shifter can be desirable for the second core 162 comprising polymer materials such as silicone, to be thermally isolated from any local heating effects from the phase shifter 150.

Examples of such configurations for the resonator core 160, 162 are shown in FIGS. 1E and 1F. For a length of resonator core composed primarily of the material with the positive thermo-optic coefficient (e.g., a known length silica or silicon core 160), it is possible to calculate how the wavelength response of the first core portion 160 material will change per degree change in temperature. One can then add to, or replace some of, the material of the first core portion 160 with the material of the second core portion 162 (e.g., polymer material). The amount added or replaced is such that, e.g., if the ambient temperature changes by one degree, the second portion 162 will add a negative phase shift to adjust for this difference in temperature to compensate for the positive phase) shift from the first portion 160.

By way of example, the length of the polymer portion 162 of the resonator core can be calculated such that $$\frac{d}{dT}(n_P \Delta L_P + n_s L_r) = 0,$$

from which:

$$\Delta L_{pol} = -L_r \frac{\left(\frac{dn_s}{dT} + n_s \alpha\right)}{\left(\frac{dn_P}{dT} + n_P \alpha\right)} \ldots,$$

where $n_s$ and $n_p$ are the silica and the polymer indices, respectively. $\Delta L_p$ is the length (or sum of lengths of different segments) of polymer waveguide portions of core 162, $L_r$ is the ring resonator's 123 circumference, and $\alpha$ is the substrate's 110 thermo-expansion coefficient. For example, if the ring resonators 123 having a first portion core 160 of silica has a circumference of 3 mm, $n_s$=1.464, $n_p$=1.4459, $dn_s/dT$=1.8e$^{-5}$ and $$\frac{dnp}{dT} = -3.6e^{-4},$$

then $\Delta L_p$ should be about 150 μm to substantially athermalize the resonator 123.

Poor mode-matching between the first core portions 160 and second core portions 162 can cause propagation losses due to light diffraction. As illustrated in FIG. 1E, to reduce propagation losses when coupling light from the first core portions 160 to the second core portions 162, separate segments of the second core portions 162 can be interleaved with separate segments of the first core portions. In some cases, propagation losses can be further minimized by having separate segments of the second core portions 162 progressively decrease in length moving in a direction away from a central region 165 of the second core portions 162.

Additionally or alternatively, as illustrated in FIGS. 1E and 1F, to reduce propagation losses when coupling light from the first core portions 160 to the second core portions 162, the first core portions 160 can be progressively decreased in widths 169 in a direction moving away from interfaces 167 between the first core and the second core portions 160, 162. Tapering the widths 169 of the first core portion 160 in this fashion helps to mode match the first and second core portions 160, 162.

Figure 1G:
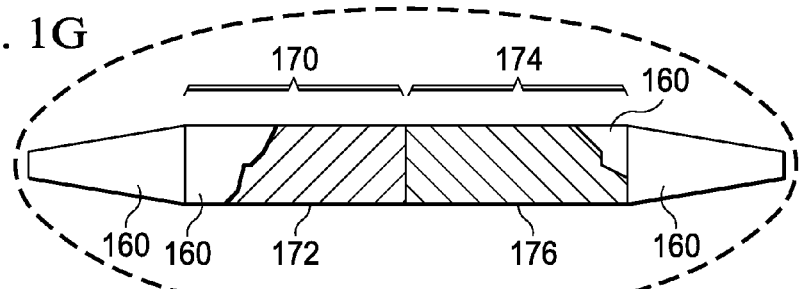

In some embodiments, such as shown in FIG. 1G. the substantially athermalized optical resonator 123 includes a portion 170 of a light-guiding core 160 clad by a first cladding material 172 having a positive thermo-optic coefficient, and, a different portion 174 of the light-guiding core 160 clad by a second cladding material 176 having a negative thermo-optic coefficient. In FIG. 1G, portions of the first and second claddings were not depicted so that the underlying core 160 could be depicted. The core 160 of the resonator 123 can be composed of a same light-guiding core material (e.g., silicon or silica). Alternatively, the core can be composed of core portions composed of different materials, e.g., core portions 160, 162 such as discussed in the context of FIGS. 1E and 1F, although propagation losses may not favor such configurations.

One skilled in the art would be familiar with computerized simulated beam propagation methods that could be used to determine desired lengths of segments or the extents of tapering of the first and second core portions 160, 162, or, of the lengths and optical index coefficients of the first and second claddings 172, 176 to optimize mode matching for the various configurations depicted in FIGS. 1E-1G.

Figure 2A:
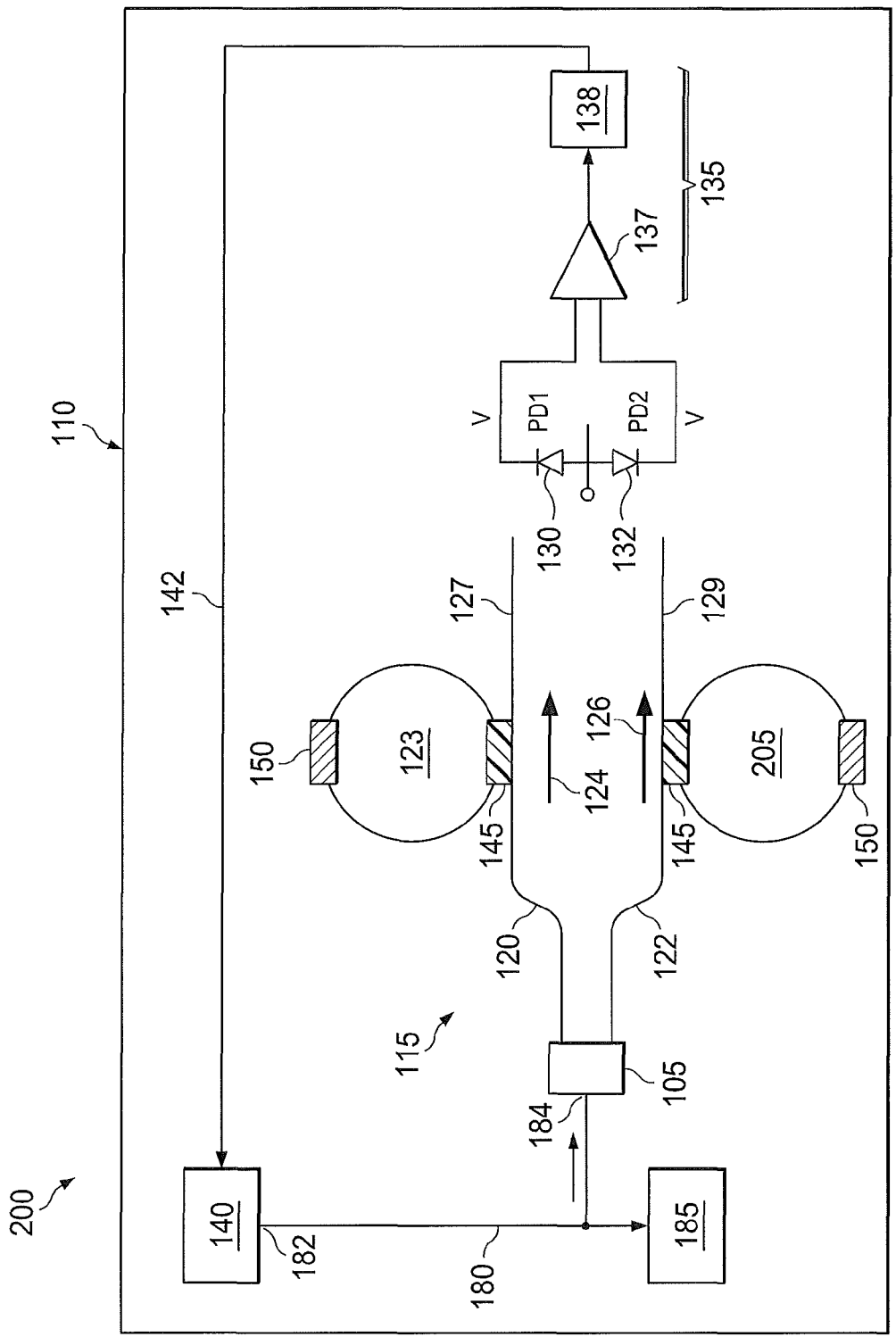
FIG. 2A presents an example optical device of the disclosure having two optical resonators.

FIG. 2A presents a layout diagram of another example optical device 200 of the disclosure. The optical device 200 comprises the 1×2 optical coupler 105, waveguide 115, the optical resonator 123 coupled to the first arm 120 of the waveguide 115, photodetectors 130, 132, and control module 135 on the planar substrate 110, such as discussed in the context of FIG. 1A. Additionally, the device 200 comprises a second optical resonator 205 on the planar substrate 110, the second optical resonator being optically coupled to the second arm 122 of the waveguide 120. In some embodiments, one or both of the optical resonators 123, 205 are substantially athermalized, e.g., using configurations discussed in the context of FIGS. 1E-1G. In some embodiments, the second optical resonator 205 also comprises an adjustable coupler 145 and phase shifter 150.

A device 200 having first and second optical resonators 123, 205 can provide the advantages of greater sensitivity and tune-ability over a device 100 with a single resonator 123.

Figure 2B:
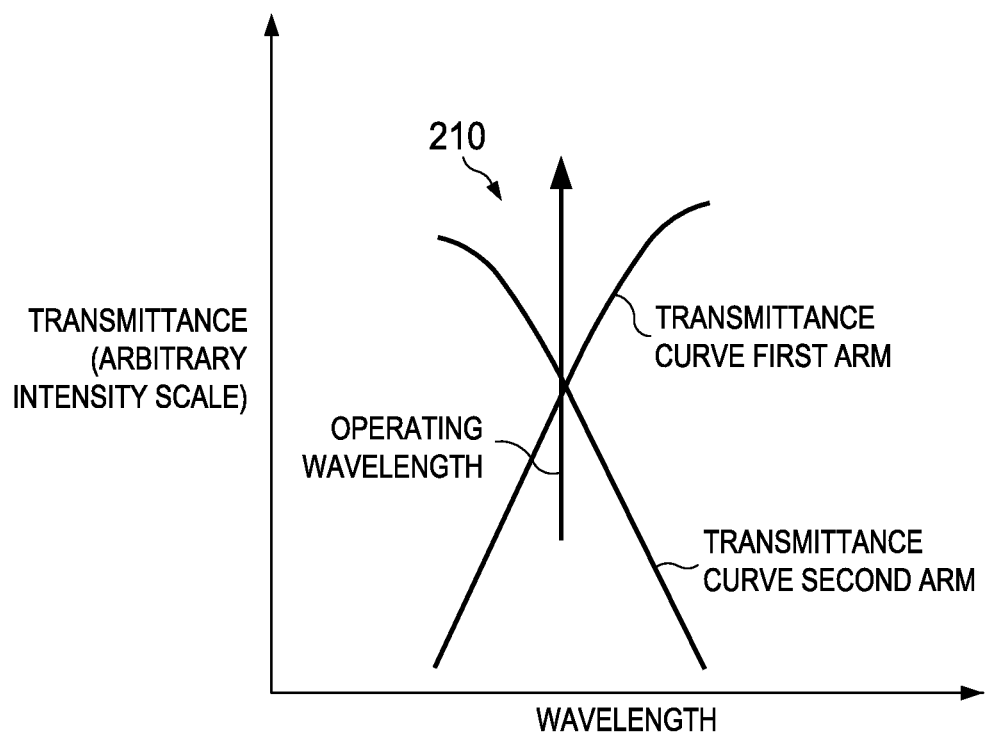
FIG. 2B presents example transmittance curves waveguide arms of an optical device of the disclosure, such as the device depicted in FIG. 2A.

FIG. 2B, shows portions of example transmittance curves as a function of wavelength, for the first and second arm 120 122 coupled to the optical resonators 123, 205, respectively. The wavelength of the light can be located on a positively sloping part of the transmittance curve for the first arm 120 and optical resonator 123, and also located on a negatively sloping part of the transmittance curve for the second arm 122 and optical resonator 205. For instance, the combined transmittance curves from the optical resonator 123 and the second optical resonator 205 can includes a v-shaped notch 210 that is centered, e.g., in the C or L optical communication bands. Consequently the sensitivity of such devices 200 to detect wavelength shifts can be greater than, e.g., a device 100 with a single optical resonator 123. In turn, the control module 135 can thereby more precisely control the output wavelength of the light-source 140 optically coupled to the 1×2 optical coupler 105, e.g., via the control signal 142.

Moreover, in embodiments where both of the optical resonators 123, 205 can be tunable optical resonators (e.g., each with their own optical coupler adjustable optical coupler 145 and phase shifter 150). The device's 200 sensitivity can be adjusted over a broader range as compared to e.g., a device 100 with a single tunable optical resonator 123. The device 200 can also be configured to operate over a wider wavelength range, e.g., by designing the full spectral range of the resonators 123, 205 to match the channel spacing of a WDM system.

Embodiments of the optical device can include other components to further monitor and control the optical output from the light-source 140. For instance, as shown in FIGS. 1A and 2A, the devices 100, 200 can include an input waveguide 180 on the planar substrate 110. One end 182 of the input waveguide 180 can be optically coupled to the light-source 140 and another end 184 of the input waveguide 180 can be optically coupled to the 1×2 optical coupler 105. A tap port 185 can be optically coupled to the input waveguide 180 (e.g., at or before the end 184). The tap port 185 can be configured to route a portion of a light (e.g., about 5 percent in some cases) from the light-source 140 to the control module 135 (or to a separate control module, not shown) which is configured to adjust light-transmission intensity from the light-source 145. For instance, the light routed to tap port 185 can be transferred to another photo-detector (not shown) which, in turn, is configured to send a signal which is proportional to the intensity of the light to the control module 135.

Figure 3:
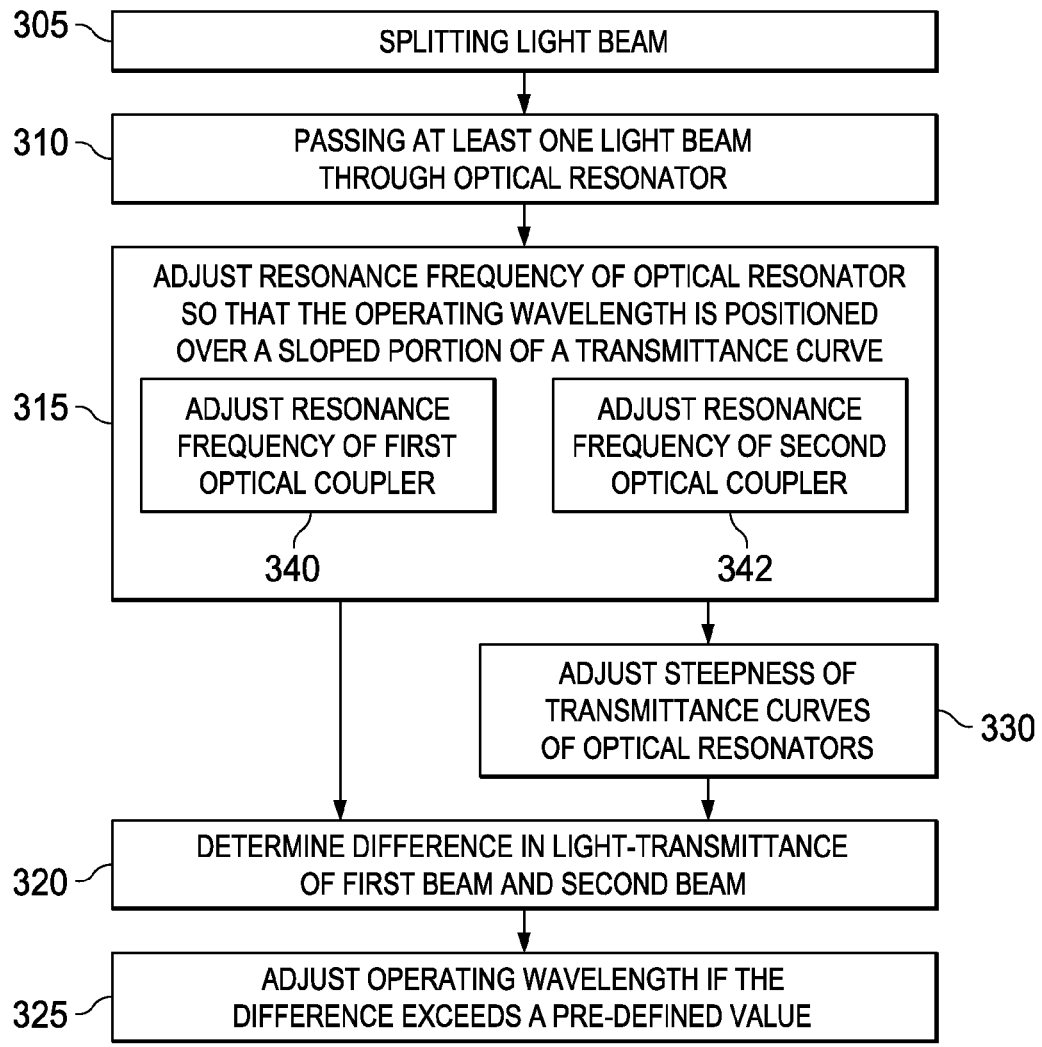
FIG. 3 presents a flow diagram of an example method of using an optical device of the disclosure, such as any of the devices discussed in the context of FIGS. 1A-2B.

Another embodiment of the disclosure is a method of using an optical device. FIG. 3 presents a flow diagram of an example method of using an optical device, such as any of the devices 100, 200 discussed in the context of FIGS. 1A-2B. With continuing reference to FIGS. 1A-2A, the method comprises a step 310 of splitting a light beam (e.g., via a 1-2 coupler 105, FIG. 1A or 2A) having some desired operating wavelength into a first beam that passes through a first arm 120 of a waveguide 115 and into a second beam that passes through a second arm 122 of the waveguide 115.

The method also comprises a step 310 passing at least one of the first or second light beams through one or more optical resonators 123 (and optionally, resonator 205) that are optically coupled to at least one of the first or second arms 120, 122. For instance, in some cases passing the light beam in step 310 includes passing the first beam through a first one of the optical resonators (e.g., resonator 123, FIG. 1A) that is optically coupled to the first arm 120, and, passing the second beam through a second one of the optical resonators (e.g., resonator 205, FIG. 2A) that is optically coupled to the second arm 205.

The method also comprises a step 315 of adjusting a resonance frequency of the one or more optical resonators 123 (e.g., including optional resonator 205) so that the operating wavelength is positioned over a sloped portion of a transmittance curve (see e.g., FIGS. 1B-C and 2B) of the one or more optical resonators 123, 205. In some cases, adjusting a resonance frequency in step 315 includes adjusting the phase of the resonator 123 (including optionally, resonator 205), e.g., via a phase shifter 150 coupled to the core of the resonator 123.

The method also comprises a step 320 of determining a difference in light-transmittance of the first beam (e.g., beam 124, FIG. 1A, 2A) exiting the first arm 120 (e.g., at end 127) and light-transmittance of the second beam (e.g., beam 126, FIG. 1A, 2A) exiting the second arm 122 (e.g., at end 129). For instance, as part of step 320 the light-transmittance of the light beams can be converted into voltages (V, FIGS. 1A, 2A) using photo-detectors 130, 132, and the voltages can be compared using a differential amplifier component 137 of a control module 135.

The method also comprises a step 325 of adjusting the operating wavelength if the difference in light-transmittance intensities exceeds a predefined value (e.g., greater than one percent in some cases). For instance, as part of step 325 if there is a voltage difference determined by the differential amplifier component 137 that exceeded a pre-defined value (e.g., an about 1 percent difference), then a control component 138 of the control module can send a control signal 142 to a light-source 140 which in turn causes the light-source 140 to emit light at a higher or lower wavelength.

Figure 4B:
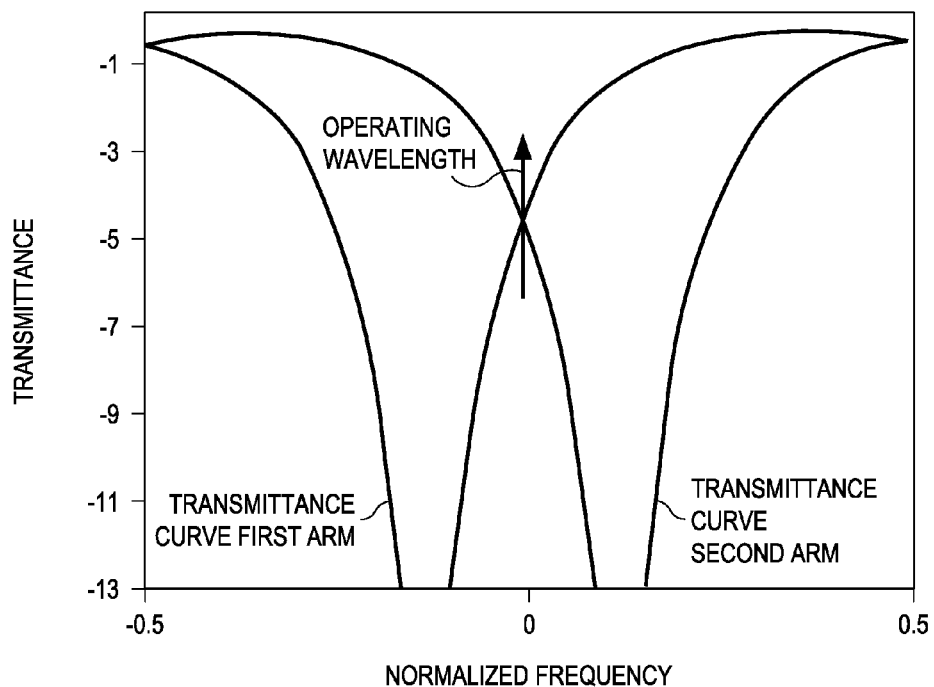
FIGS. 4A and 4B present example transmittance curves waveguide arms of an optical device of the disclosure, such as the device depicted in FIG. 2A.
Figure 4A:
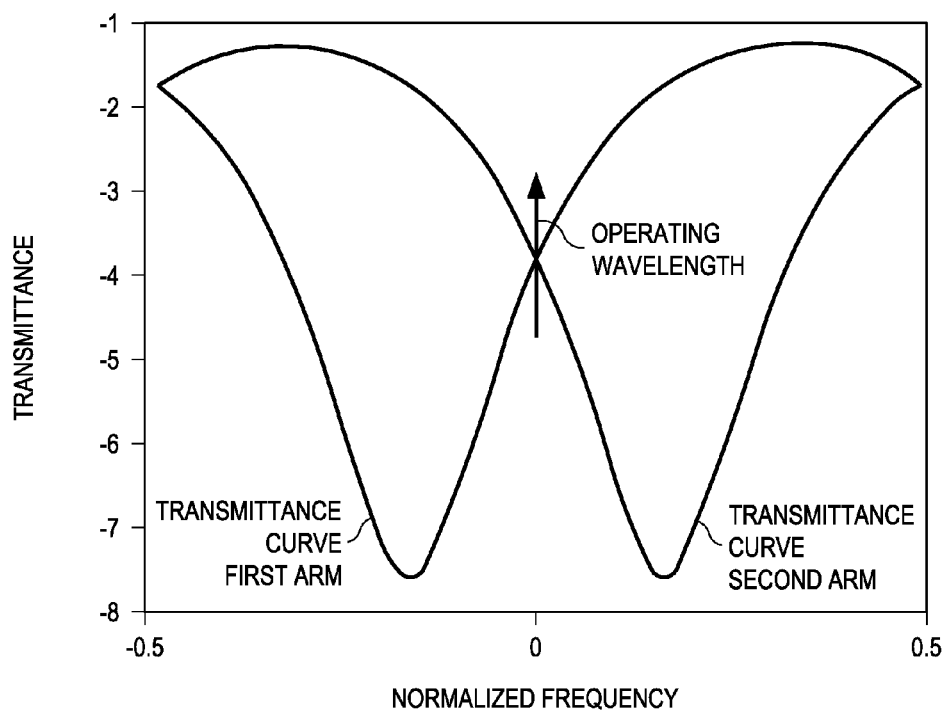

Some embodiments of the method of use further include a step 330 of adjusting a steepness of a transmittance curve of the one or more optical resonator 123 (and optionally, resonator 205) such that the operating wavelength of the light-source 140 is centered on a steeper-sloped or a shallower-sloped portion of the transmittance curve. For instance, FIGS. 4A and 4B present portions of example transmittance curves of two optical resonators (e.g., resonators 123, 205 in FIG. 2A). Adjusting the extent of optical coupling of the resonator 123 and second resonator 205 with optically coupled arm 120 and second arm 122, respectively, can produce either the transmittance curves in FIG. 4A or in FIG. 4B. For instance, reducing the optical coupling (e.g., via an adjustable couplers 145) can transform the transmittance curves from that shown in FIG. 4A to that shown in FIG. 4B.

FIGS. 4A and 4B also illustrate embodiments of adjusting the resonance frequencies of optical resonators 123, 205, as part of step 315. Such embodiments can further include a step 340 of adjusting a first optical coupler 145 coupled to the first arm 120 and the first optical resonator 123 to change a resonance frequency of the first optical resonator 123 such that the operating wavelength is centered on a positively-sloped portion of the transmittance curve of the first optical resonator 123. Such embodiments can also include a step 342 of adjusting a second optical coupler 145 coupled to the second arm 120 and the second optical resonator 205 to change a resonance frequency of the second optical resonator 205 such that the operating wavelength is centered on a negatively-sloped portion of the transmittance curve of the second optical resonator 205.

Figure 5:
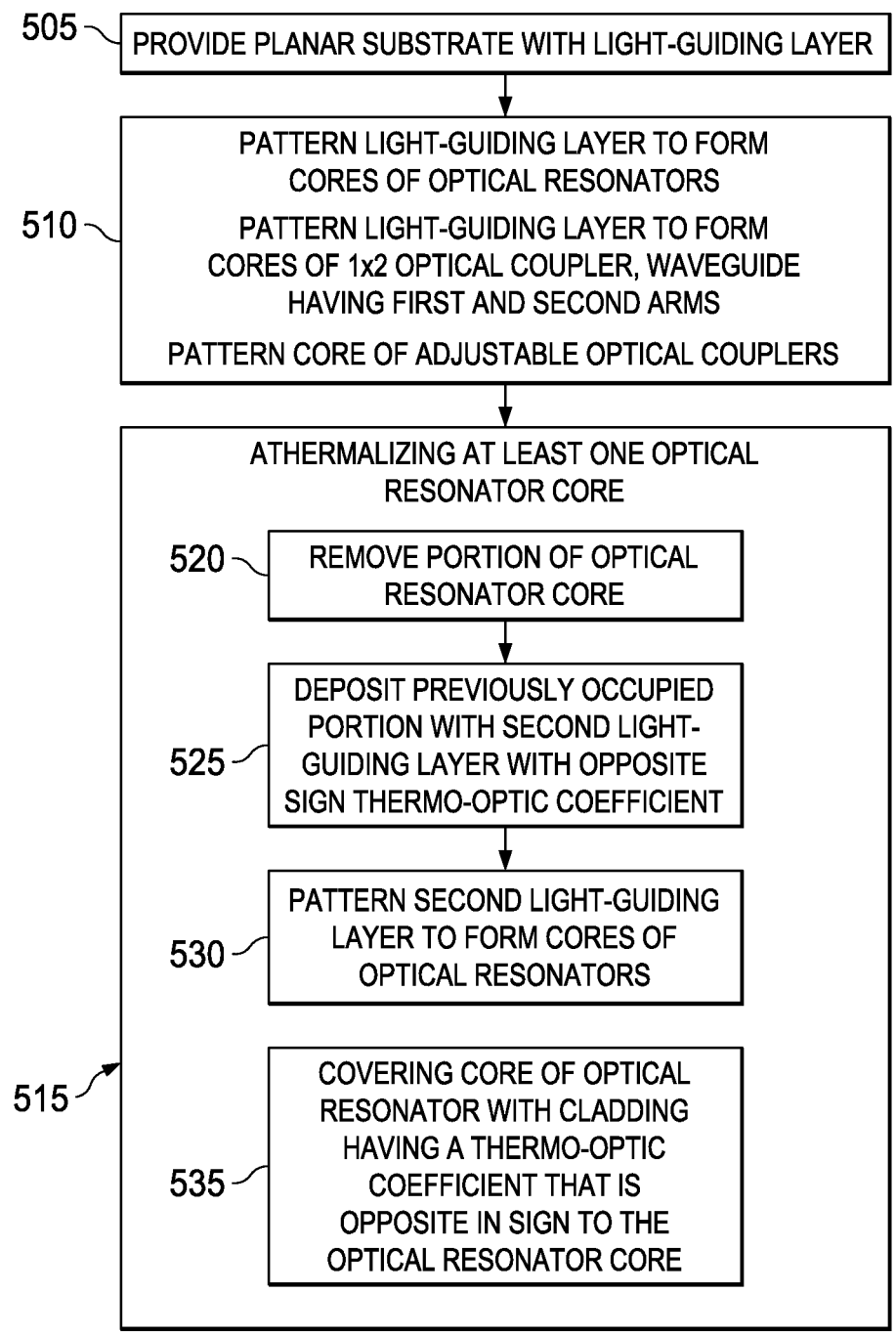
FIG. 5 presents a flow diagram of an example method of manufacture an optical device of the disclosure, such as any of the devices discussed in the context of FIGS. 1A-4B.

Another embodiment of the disclosure is a method of manufacturing an optical device. FIG. 5 presents a flow diagram of an example method of manufacturing an optical device, such as any of the devices 100, 200 discussed in the context of FIGS. 1A-4B.

The method comprises a step 505 of providing a planar substrate (e.g., substrate 110, FIG. 1A, 2A), wherein the planar substrate includes a light-guiding layer located on a light-cladding layer. For example, providing the substrate can include providing a silicon-on-insulator substrate, or blanket depositing a cladding layer of silicon oxide on the planar substrate and blanket depositing a light-guiding layer of silicon on the silicon oxide cladding layer.

The method also comprises a step 510 of patterning the light-guiding layer to form light-guiding cores of one or more optical resonators (e.g., resonators 123, 205, in FIGS. 1A and 2A). In some cases, the patterning the light guiding layer in step 510 further includes patterning the light-guiding layer to form light-guiding cores of a 1×2 optical coupler (e.g., coupler 105, in FIGS. 1A and 2A), of a waveguide having first and second arms (e.g., waveguide 115, having arms 120, 122, in FIGS. 1A and 2A). The cores of first and second arms are both coupled to the 1×2 optical coupler core, and the cores of the one or more optical resonators 123, 205 that are separately optically coupled to the first arm 120 or second arm 122, respectively. In some cases; the patterning step 510 further includes patterning adjustable optical couplers that are optically coupled to the resonators (e.g., adjustable optical couplers 145 in FIG. 1A, 1D, 2A).

The method further comprises a step 515 of substantially athermalizing at least one of the optical resonator cores.

In some cases, substantially athermalizing in step 515 further includes a step 520 of removing a portion of the at least one optical resonator cores (e.g., portions of the resonator core 160, 162, FIG. 1E, 1F), and, a step 525 of depositing a second light-guiding layer on the region previously occupied by the removed portion. The second light-guiding layer has a thermo-optic coefficient with an opposite sign to a thermo-optic coefficient of the first light-guiding layer. For instance in some cases, the first light-guiding layer can include a silicon or silicon oxide layer having a positive thermo-optic coefficient, while the second light-guiding layer can include a silicone layer having a negative thermo-optic coefficient. In other cases, the first light-guiding layer can include a silicone layer having a negative thermo-optic coefficient, while the second light-guiding layer can include a silicon or silicon oxide layer having a positive thermo-optic coefficient. Substantially athermalizing in step 515 can further include a step 530 of patterning the second light-cladding layer to form replacement portions of the at least one optical resonator cores (e.g., the second core portions 162 of FIG. 1E or 1F).

In some cases, substantially athermalizing in step 515 further includes a step 535 of covering at least one of the light-guiding optical resonators cores of one or more optical resonators cores with a cladding layer. The cladding layer has a thermo-optic coefficient with an opposite sign to a thermo-optic coefficient of the at least one light-guiding optical resonator cores. For instance, in some cases the light-guiding optical resonators core can be composed of silicon or silicon oxide having a positive thermo-optic coefficient, while the cladding can be composed of silicone having a negative thermo-optic coefficient. In other cases, the light-guiding optical resonators core can be composed of silicone having a negative thermo-optic coefficient, while the cladding can be composed of silicon or silicon oxide having a positive thermo-optic coefficient.

One skilled in the art would be familiar with other steps that could be performed to form other components of the optical device, including forming phase shifters that are coupled to the resonators or to the adjustable optical couplers of the device, from the photo-detectors on the substrate, or forming the control module of the substrate, and provided a light-source, such as a laser light-source.

Although the embodiments have been described in detail, those of ordinary skill in the art should understand that they could make various changes, substitutions and alterations herein without departing from the scope of the disclosure.

What is claimed is:

1. An optical device, comprising:
a 1×2 optical coupler on a planar substrate;
a waveguide structure on said planar substrate, said waveguide structure having a first waveguide arm and a second waveguide arm coupled to said 1×2 optical coupler; and
an optical resonator on said planar substrate, wherein said optical resonator is optically coupled to said first waveguide arm and said optical resonator is substantially athermalized
wherein
said substantially athermalized optical resonator includes:
a sequence of end-coupled and spaced-apart segments of a light-guiding core having a thermo-optic coefficient, and,
optical material between adjacent ones of said segments, said optical material having thermo-optic coefficient of opposite sign than a sign of said thermo-optic coefficient of said spaced-apart segments.

2. The optical device of claim 1, further including:
first and second photo-detectors located on said planar substrate and optically coupled to output ends of said first waveguide arm and said second waveguide arm, respectively; and
a control module located on said planar substrate, wherein said control module is electrically coupled to said first and second photo-detectors and is configured to control an output wavelength of a light-source optically coupled to said 1×2 optical coupler.

3. The optical device of claim 2, further including a laser light-source optically coupled to said 1×2 optical coupler and wherein said control module is configured to control light output from said light-source.

4. The optical device of claim 1, wherein said optical resonator further includes an adjustable optical coupler optically coupled to said first waveguide arm and to a light-guiding portion of said resonator.

5. The optical device of claim 1, wherein said optical resonator further includes a phase shifter optically coupled to a light-guiding core of said resonator.

6. The optical device of claim 1, wherein said optical resonator further includes a phase shifter optically coupled to portions of said light-guiding core which do not include said second core.

7. The optical device of claim 1, further including a second optical resonator on said planar substrate, wherein said second optical resonator is optically coupled to said second waveguide arm and said second optical resonator is substantially athermalized.

8. The optical device of claim 1, further including:
an input waveguide on said planar substrate, one end of said input waveguide optically coupled to a light-source and another end of said input waveguide optically coupled to said 1×2 optical coupler; and
a tap port optically coupled to said input waveguide, said tap port configured route a portion of a light from said light-source to a control module, said control module configured to adjust light-transmission intensity from said light-source.

9. The optical device of claim 1, wherein the waveguide structure is a distinct structure from the optical resonator.

10. The optical device of claim 1, wherein the 1×2 optical coupler is a directional coupler.

11. The optical device of claim 1, wherein the 1×2 optical coupler is a 50/50 Y-splitter.

12. An optical device, comprising:
   a 1×2 optical coupler on a planar substrate;
   a waveguide structure on said planar substrate, said waveguide structure having a first waveguide arm and a second waveguide arm coupled to said 1×2 optical coupler; and
   an optical resonator on said planar substrate, wherein said optical resonator is optically coupled to said first waveguide arm and said optical resonator is substantially athermalized, wherein said substantially athermalized optical resonator includes:
      a sequence of spaced-apart and end-coupled segments of a light-guiding core, each segment having a thermo-optic coefficient of a first sign and,
      optical material between the segments, the material having a thermo-optic coefficient of an opposite second sign, and
   wherein said first core portions progressively decreases in width in directions distal to interfaces between said light-guiding core and the optical material between the segments.

13. An optical device, comprising:
   a 1×2 optical coupler on a planar substrate;
   a waveguide structure on said planar substrate, said waveguide structure having a first waveguide arm and a second waveguide arm coupled to said 1×2 optical coupler; and
   an optical resonator on said planar substrate, wherein said optical resonator is optically coupled to said first waveguide arm and said optical resonator is substantially athermalized, wherein said substantially athermalized optical resonator includes:
      a sequence of spaced-apart and end-coupled segments of a light-guiding core, each segment having a thermo-optic coefficient of a first sign, and,
      optical material between the segments, the material having a thermo-optic coefficient of an opposite second sign.

14. An optical device, comprising:
   a 1×2 optical coupler on a planar substrate;
   a waveguide structure on said planar substrate, said waveguide structure having a first waveguide arm and a second waveguide arm coupled to said 1×2 optical coupler;
   an optical resonator on said planar substrate, wherein said optical resonator is optically coupled to said first waveguide arm and said optical resonator is substantially athermalized; and
   a second optical resonator on said planar substrate, wherein said second optical resonator is optically coupled to said second waveguide arm and said second optical resonator is substantially athermalized, wherein combined transmittance curves from said optical resonator and said second optical resonator includes a v-shaped notch centered in a C or L optical communication band.

15. An optical device, comprising:
   a 1×2 optical coupler on a planar substrate;
   a waveguide structure on said planar substrate, said waveguide structure having a first waveguide arm and a second waveguide arm coupled to said 1×2 optical coupler;
   first and second optical resonators on said planar substrate, wherein said first optical resonator is optically coupled to said first waveguide arm and said second optical resonator is optically coupled to said second waveguide arm;
   first and second photo-detectors located on said planar substrate and optically coupled to output ends of said first waveguide arm and said second waveguide arm, respectively; and
   a control module located on said planar substrate, wherein said control module is electrically coupled to said first and second photo-detectors and is configured to control an output wavelength of a light-source optically coupled to said 1×2 optical coupler, wherein
   combined transmittance curves from said first optical resonator and said second optical resonator includes a v-shaped notch centered in a C or L optical communication band.

16. The optical device of claim 15, wherein said first optical resonator and said second optical resonator are both substantially athermalized.

17. The optical device of claim 15, wherein the waveguide structure is a distinct structure from the optical resonator.

18. The optical device of claim 15, wherein the 1×2 optical coupler is a directional coupler.

19. The optical device of claim 15, wherein the 1×2 optical coupler is a 50/50 Y-splitter.

* * * * *